United States Patent [19]

Rowland et al.

[11] 3,988,666

[45] Oct. 26, 1976

[54] MULTIPLEX CABLE INSULATION FAULT LOCATOR SYSTEM WITH ELECTRICAL CONDUCTING GUIDES MOUNTED ON A ROTATING DISC

[75] Inventors: Bobby A. Rowland; Dwight H. Durham; O. Leon Thomas, all of Carrollton, Ga.

[73] Assignee: Southwire Company, Carrollton, Ga.

[22] Filed: Jan. 12, 1976

[21] Appl. No.: 648,215

[52] U.S. Cl. ................................................. 324/54
[51] Int. Cl.² ..................................... G01R 31/12
[58] Field of Search .................. 324/52, 54; 140/149

[56] References Cited
UNITED STATES PATENTS

| | | | |
|---|---|---|---|
| 2,635,136 | 4/1953 | Duffy | 324/54 |
| 2,942,181 | 6/1960 | Edwards et al. | 324/54 |
| 3,267,369 | 8/1966 | McLoad | 324/54 |
| 3,310,735 | 3/1967 | Peschel | 324/54 |
| 3,710,241 | 1/1973 | Dineen | 324/54 |
| 3,763,426 | 10/1973 | Wilkes | 324/54 |

*Primary Examiner*—Gerard R. Strecker
*Attorney, Agent, or Firm*—Van C. Wilks; Herbert M. Hanegan; Stanley L. Tate

[57] ABSTRACT

A fault locator system for multiplex cable, which includes a bare wire and three insulated wires stranded together. The system includes the separation of the bare conductor from the insulated conductors on a rewind line and the applying of an electric field (electromagnetic field) or dielectric field around the insulated conductors so that one can, by a signal or a bell, alarm, buzzer or the like, locate the fault and stop the rewind line at the fault location. The apparatus of the system includes a rotating disc structure which contains electrical conducting guides through which each insulated strand of the multiplex cable passes and is tested for insulation holes or faults. A high voltage signal is placed on the electrical conducting guides for the insulated strands by means of a brush electrode, which sets up an electrical field surrounding the portion of the insulated strand in the guide. By means of a spark tester connected to each insulated strand, a fault in the insulation is detected as it passes through the surrounding electromagnetic field. The rotating disc, which is synchronized with the cable pull-out capstan or take-up machine, untwists the cable on the entry side and retwists it on the exit side. The apparatus of the present invention thus separates the insulated, plexed cables, checks continuously for faults as the cable passes through it, and then puts the cable back into its plexed state. In one embodiment (FIGS. 1–3) the rotating wheel or disc is free floating and is driven by the cable as the cable is drawn through it, while in the second embodiment (FIGS. 4 and 5), the disc structure is positively driven by an internal drive mechanism.

12 Claims, 5 Drawing Figures

MULTIPLEX CABLE INSULATION FAULT LOCATOR SYSTEM WITH ELECTRICAL CONDUCTING GUIDES MOUNTED ON A ROTATING DISC

BACKGROUND OF THE INVENTION

1. Field of the Invention

The present invention relates to a system for locating faults in multiplex cables which include an uncovered conductor along with strands of insulated conductors, which system includes the application of an electromagnetic or dielectric field after separation of the uncovered conductors from the insulated ones. By means of a rotating wheel or disc, at which the testing of the cable is done, the insulated, plexed cable is separated and then put back in its plexed state.

2. Prior Art

There has been a long-standing need for a satisfactory method of locating dielectric failures or insulation faults caused by holes in the insulation in a multiplex conductor.

Normally these faults in regular cables can be located by water testing, or by rewinding the cable and sending it through a spark tester.

However, in the case of a multiplex cable, there is a bare conductor present, which prevents it from being run through a spark tester. In a multiplex cable, there are typically three insulated wires and one bare wire stranded together.

The prior art "water test" way to test for faults is very time consuming. The cable is put in the water test tank, a voltage is then applied to the water, and, based on the results, the operator would know whether or not there was a fault in the conductors, but would not know the location of the fault. After discovery of a fault, the cable would have to be rewound and cut into two pieces. These two pieces would then be put back in the water tester and that portion containing the fault would be isolated. The faulty portion of the cable would then be scrapped because the length quickly got too short to test.

Another prior art way was to rewind the cable from one winder to another. Using this procedure an operator would wind off 20 to 30 feet of wire and drop it into the water tester and apply voltage to it. This method is dangerous to operating personnel near the cable.

These prior art techniques are thus "blind" tests depending substantially on trial and error methods.

GENERAL DISCUSSION OF THE PRESENT INVENTION

The solution to the problem of locating faults in multiplex cable provided by the present invention is to separate the bare conductor from the insulated conductors on a rewind line and apply an electric field (electromagnetic field) or dielectric field around the insulated conductors so that one can, by a signal or a bell, alarm, buzzer or the like, locate the fault and stop the rewind line at the fault location.

One way of accomplishing this in the present invention is to build a rotating disc and let the twist of the cable rotate the disc. The disc is free floating (sitting on bearings) and, as the cable is being pulled through a non-conductive eyelet, since the cable is already twisted, it rotates the disc. The disc is made of a non-conductive material. By use of a brush electrode or by a brush riding on one edge of the disc located by a small bushing through which the conductor is being pulled, one can in the present invention selectively not only locate the position of the fault, but the conductor which has the fault.

A second way of accomplishing this in the present invention is to positively drive the rotating disc by means of an integrated drive mechanism.

In contrast to the prior art, the present invention is positive, efficient and safe.

BRIEF DESCRIPTION OF THE DRAWINGS

For a further understanding of the nature and objects of the present invention, reference should be had to the following detailed description, taken in conjunction with the accompanying drawings, in which like parts are given like reference numerals and wherein:

FIG. 1 is a perspective view of the preferred embodiment of the present invention with the upper safety shield phantom lined in; while

FIG. 4 is a side view of a second embodiment of the present invention with the upper safety shield phantom lined in and the central portion of the machine partially cut away to show the internal structure of the rotating disc structures; while

DESCRIPTION OF THE PREFERRED EMBODIMENTS

Figure 1:
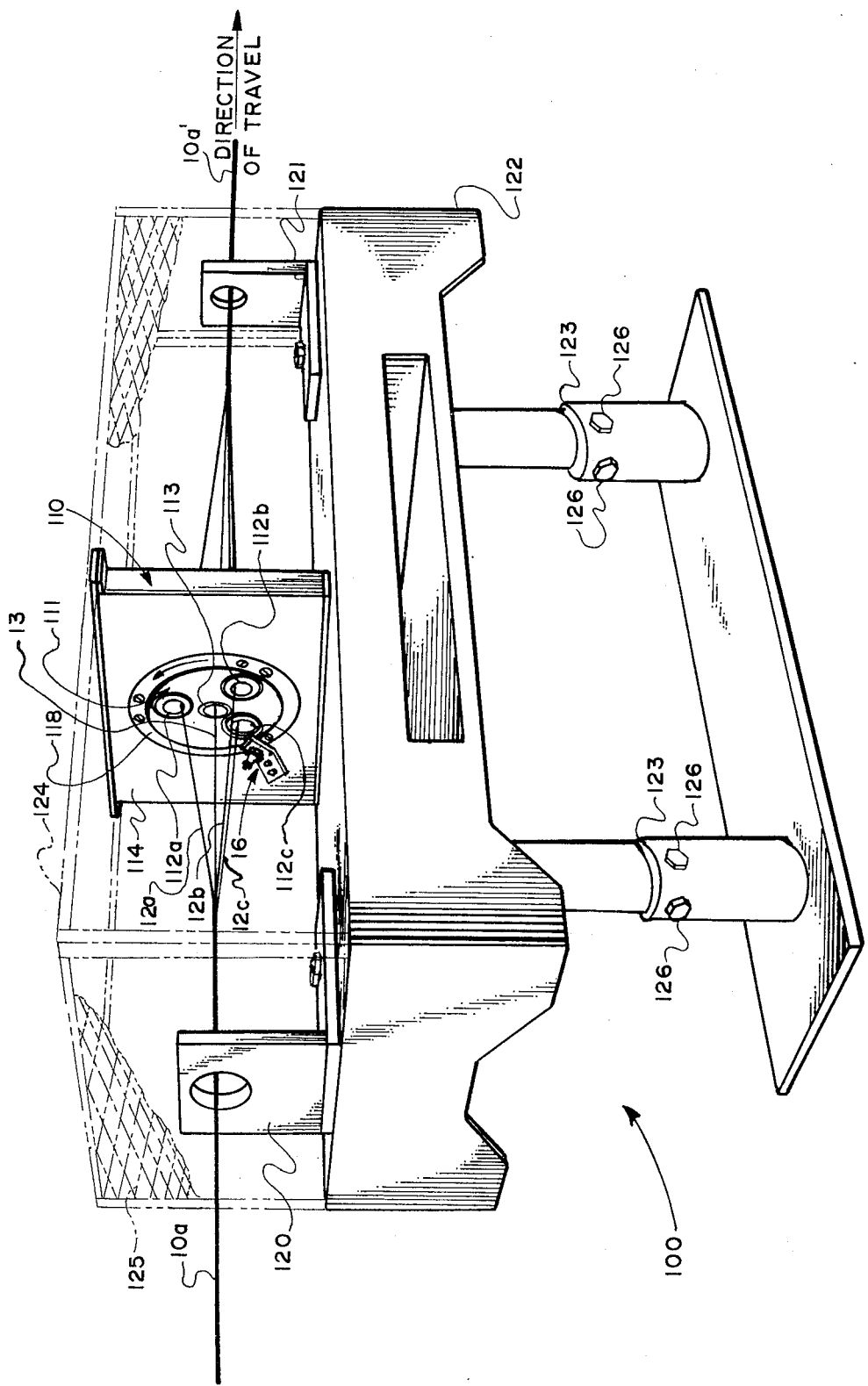
Figure 3:
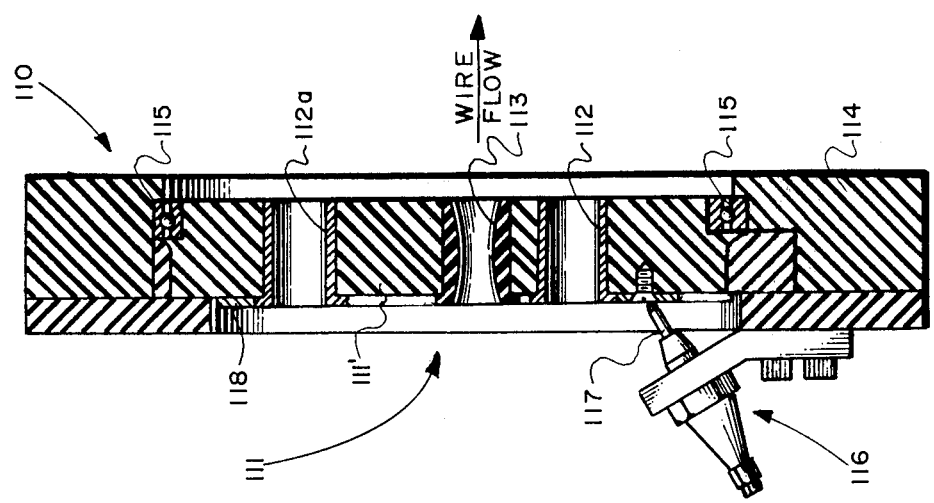
FIGS. 2 and 3 are front and side, cross-sectional views, respectively, of the rotating disc with attached commutator brush of the preferred embodiment of FIG. 1, with FIG. 3 being taken along section lines 3—3 of FIG. 2.
Figure 2:
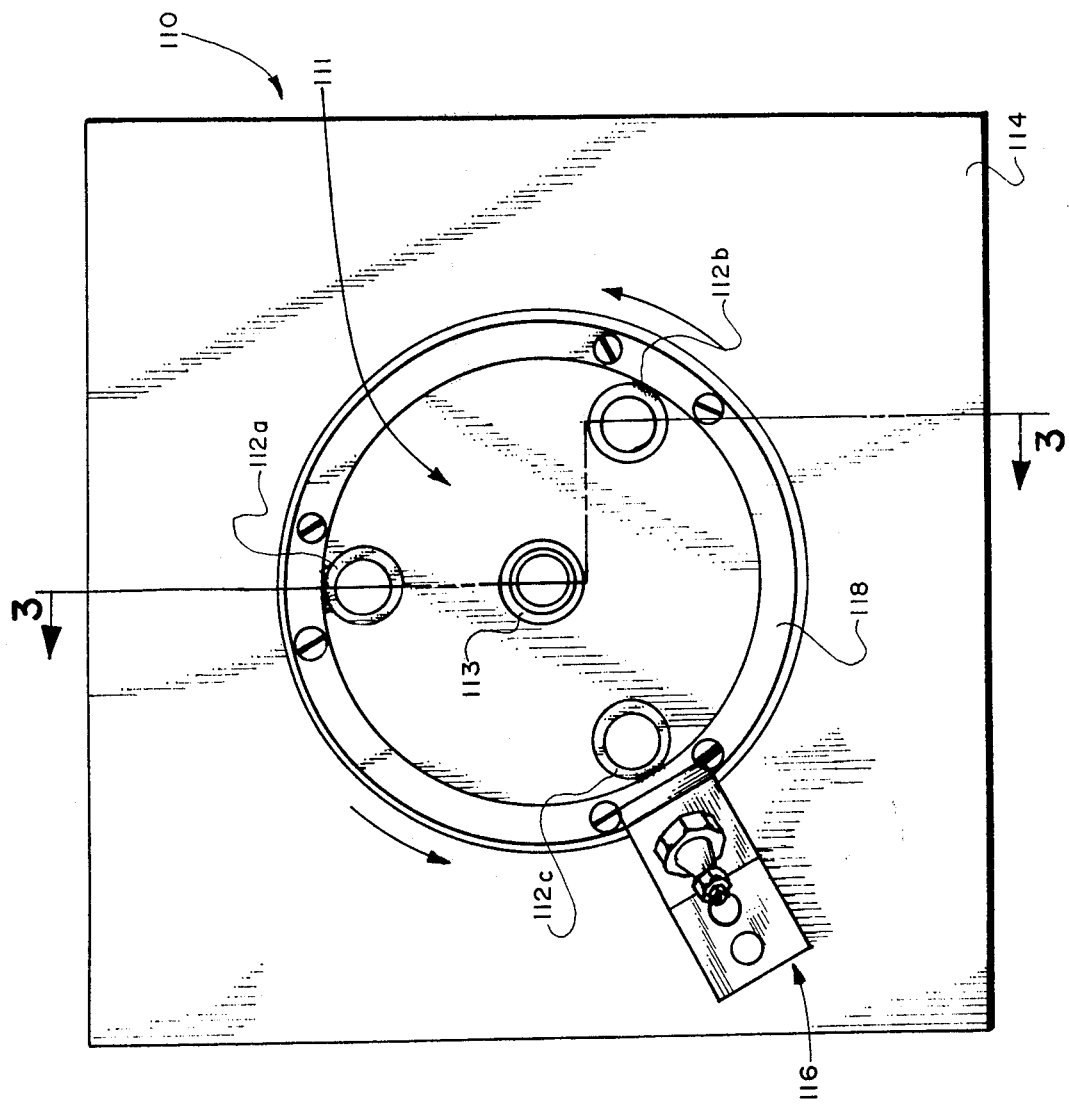

In the first preferred embodiment 100 of the present invention, illustrated in FIGS. 1-3, an exemplary four strand, bare ground multiplex cable 10a is fed into inlet guide 120 and, after being untwisted, is fed to the fault locator section 110, and finally, after being retwisted, leaves the machine 100 through outlet guide 121 in its fully tested, retwisted state 10a', ready for use. The multiplex cable 10 includes a centrally located, bare ground conductor wire 13 surrounded by three insulated conductor wires 12a–c. When the multiple cable 10a is untwisted, the insulated conductors 12a–c are individually fed through the outer, conductive bushings 112a–c symmetrically and evenly disposed about and through the rotatable disc 111, while the bare conductor 13 is fed through the central, non-conductive bushing 113. As clearly shown in FIG. 3, conductive bushings 112a–c are hollow tubular members.

The rotatable disc 111 includes on it an outer, conductive metal ring 118 which makes good electrical contact with the outer, conductive bushings 112a–c, while the main body 111' of the disc 111 is made of insulative or electrically non-conductive material. The disc 111 is freely supported for free rotation within the outer housing 114 by means of a series of roller bearings 115.

Mounted on the face of the fault detector section 110 is an electrical commutator 116 which through brush 117 engages the outer, conductive ring 118. A standard spark detector (not illustrated) is used with the machine and is connected to the insulated conductors 12a–c while the machine is in operation and the insulated conductors are being tested.

The rotatable disc 111 thus has five holes or bushings 112a–c and 113, the outer 112a–c of which are attached to the ring 118 on which the commutator 116 bears. To insure good electrical contact between the ring 118 and the conductive bushings 112a–c, the ring 118 is silver soldered to the bushings 112a–c and the three contact areas.

In operation a high voltage from a voltage source (not illustrated) is applied to the ring 118 through commutator electrode 116 and hence to the conductive bushings 112a–c, resulting in an electrical high voltage field being set up around the outside of each of the supposedly insulated conductors 12a–c, respectively, each of which are grounded. Thus, in operation, a high voltage potential is present between the outside area of the insulated conductors 12a–c and the internal metal which makes up the conductor itself.

If, in operation, any faults appear anywhere in the insulation at any angle, the spark tester will pick it up, actuating for example a light and stopping the machine 100. The machine operator then can repair the faulty insulated portion(s) of the noted conductor(s). As an alternate to a light, the spark tester can include a bell, alarm, buzzer or the like, which is in contact with the bare or uncovered conductor 13 and is actuated when an insulation fault passes one of the outer holes or bushings 112a–c.

After the insulated conductors 12a–c of the cable 10a are passed through the fault detector section 110 for testing, they are automatically retwisted with the bare conductor 13 in the machine on the exit side of the fault detector section 110. Thus, the entire circumference of each insulated strand of the cable 10a is tested as it goes through the machine 100, and the strands are then automatically returned to the normal twist in the cable 10a'.

As seen in FIG. 1, the test section 110 along with inlet and outlet guides 120, 121 are mounted on a basic frame 122 supported on telescoping legs 123 with set bolts 126. The inlet and outlet guides 120, 121 can include within their guide openings non-conductive heanium bushings or eyelets. A top safety guard is provided over the operative sections of the machine made up of flattened expanded metal 125 carried by an appropriate frame 124.

Because the disc 111 is freely rotatable on the bearings 115, the inherent bias or twist in the cable 10a is usually sufficient on its own to cause the disc 111 to rotate, in turn causing the exiting strands to be retwisted. However, should the multiplexed cable be such that the inherent bias of the cable is not sufficient, the disc 111 can be positively and internally driven, and such positive drive is included in the second preferred embodiment of the present invention, as illustrated in FIGS. 4 and 5.

Figure 4:
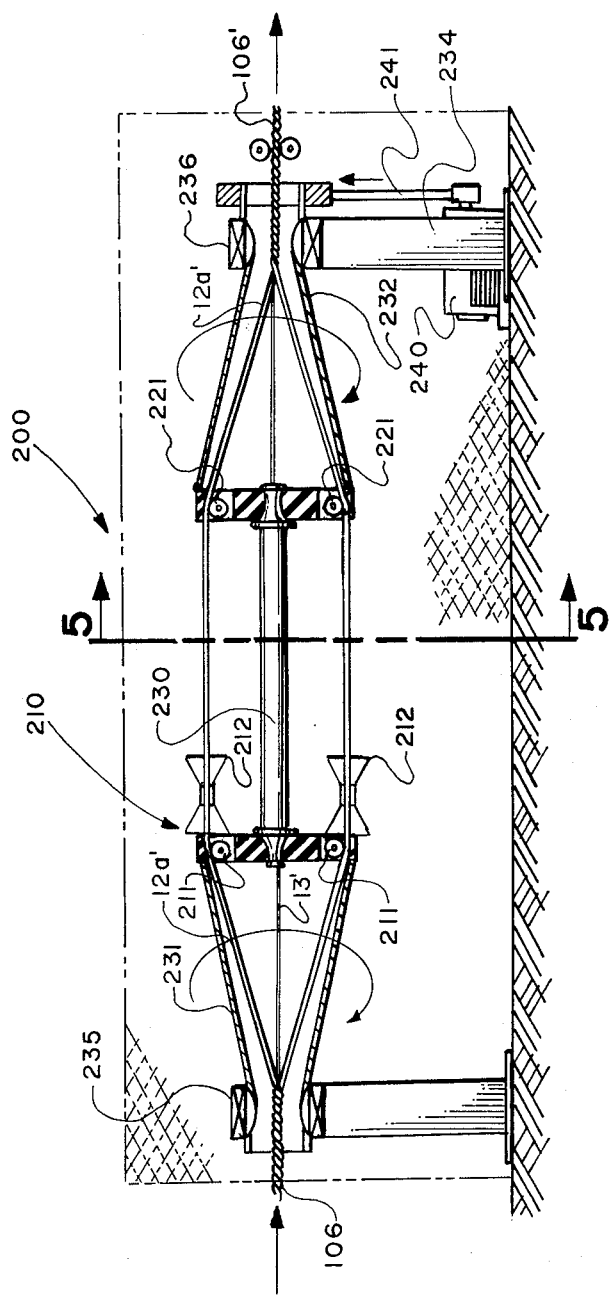
Figure 5:
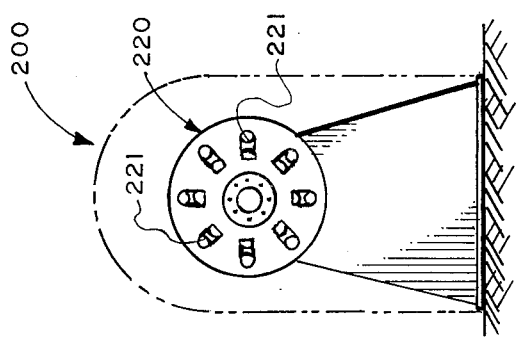
FIG. 5 is an end, cross-sectional view of the embodiment of FIG. 4, taken along section lines 5—5 thereof.

The embodiment 200 of FIGS. 4 and 5 includes two, separated by connected, rotating disc structures 210, 220, similar in a sense to rotary stranders connected to each other. The dics structures 210, 220 are centrally connected together by rigid member 230, and are each supported by outer cone, end members 231, 232, which in turn are supported for rotation on vertical support legs 223, 234 by slip rings and bearings 235, 236, respectively.

Located within peripheral openings in the disc structures 210, 220 are pulley wheels 211, 221 (note FIG. 5). Mounted on the entry disc structure 210 at the exit of each pulley wheel opening is a series of hour-glass conductive electrodes 212. A sufficient number of openings and pulley wheels 211 and electrodes 212 are provided to handle the maximum number of insulated conductors 12a'+ in the multiplex cable to be tested.

The multiplex cable 10b is fed into the central opening of the entry, cone-shaped member 231 and, after the cable 10b is untwisted, the central bare wire conductor 13' is fed through the central longitudinal opening in rigid member 230, while the insulated conductors 12a'+ are fed through the peripheral openings about the pulley wheels 211 and through the electrodes 212. The insulated conductor strands 12a' then continue through the openings in disc structure 220 about the pulley wheels 221 and, upon being retwisted together, exit out of the machine 200.

In operation, a high voltage is applied by an appropriate electrical system (not illustrated) including an electrical commutator system to the elongated, conductive electrodes 212 setting up a high voltage field individually about the insulated conductors 12a'+ passing therethrough, in the fashion to bushings 112 of the first embodiment 100. After the conductors 13', 12a' + pass through the exit disc structure 220, the conductor strands are retwisted back into their multiplex state 10b. Because the electrical operation of the two embodiments 100, 200 are substantially the same, a detailed description is not considered necessary or desirable and reference is had to the description of the first embodiment 100 for a further understanding of the operation of the second embodiment 200.

However, in contrast to the free rotation of the disc 111 of embodiment 100, the disc structures 210, 220 are positively and internally driven by means of an internal motor 240 which drives the end of the exit, cone shaped member 232 through belt drive 241. It is noted that the direction of rotation in the two embodiments 100, 200 are for illustrative purposes oppositely indicated by the rotation directional arrows in the figures. The actual direction of rotation will of course depend on the direction of the wrapping of the strands of the multiplex cable.

The above embodiments are, of course, merely exemplary of the possible changes or variations. Because many varying and different embodiments may be made within the scope of the inventive concept herein taught and because many modifications may be made in the embodiments herein detailed in accordance with the descriptive requirements of the law, it should be generally understood that the details herein are to be interpreted as illustrative and not in a limiting sense.

What is claimed as the invention is:

1. A fault locator system for multiplex cable having multiple strands of insulated conductors therein twisted together comprising:

a rotatable disc structure having a series of elongated hollow tubular conductive members therein insulated from each other and symmetrically and evenly disposed about its center of rotation, said disc structure having an entry side and an exit side and having an electrical commutator system electrically connected to said conductive members for setting up an electromagnetic field within each said conductive members;

a high voltage source connected to said commutator system;

support means for supporting said disc structure allowing the rotation thereof, the insulated strands of the multiplex cable being untwisted from each other on the entry side of said disc structure and being fed each individually through a separate one of said conductive members, the insulated strands being retwisted on the exit side of said disc structure as the multiplex cable is passed through said disc structure; and electrical detection means connected to the conductive wires in the insulated strands for detecting any changes in the electrical signals set up in the conductive wires caused by faults in the insulation when the faulty portions of the insulated strands pass through said conductive members and the electromagnetic fields set up therein.

2. The system of claim 1 wherein the multiplex cable includes a centrally located bare conductor strand, the insulated strands being wrapped around the bare conductor strand, and wherein said rotatable disc structure further includes a central aperture therein at its axis rotation, the inner surface of said central aperture being electrically insulated from said conductive members and said commutator system, the bare conductor strand being fed through said central aperture.

3. The system of claim 2 wherein said rotatable disc structure is freely mounted for rotation, having no internal drive therefor, the inherent bias in the twisted strands of the multiplex cable at the entry side of said disc structure serving to cause it to rotate, in turn causing the strands to be retwisted together on the exit side of said disc structure as the multiplex cable is pulled through said disc structure.

4. The system of claim 1 wherein said disc structure is in the form of a generally flat disc rotating within a housing.

5. The system of claim 2 wherein said disc structure comprises two disc structures separate but joined together by means of a central, rigid, hollow member, said central, hollow member serving as said central aperture for the bare conductor strand.

6. The system of claim 5 wherein said disc structures have peripheral openings therein in juxtaposition to but in front of said conductive members with rotatable pulley wheels positioned in said openings for guiding the insulated strands through said openings into said conductive members.

7. The system of claim 6 wherein there is further included integral drive means attached to said disc structures for independently driving said disc structures.

8. A fault locator device for detecting insulation faults in multiplex cable having multiple strands of insulated conductors therein twisted together comprising:

a rotatable disc structure having a series of elongated hollow tubular conductive members therein insulated from each other and symmetrically and evenly disposed about its center of rotation, said disc structure having an entry side and an exit side and having an electrical commutator system adapted to be coupled to a high voltage source electrically connected to said conductive members for setting up an electromagnetic field within each said conductive members; and support means for supporting said disc structure allowing the rotation thereof, the insulated strands of the multiplex cable being untwisted from each other on the entry side of said disc structure and being fed each individually through a separate one of said conductive members, the insulated strands being retwisted on the exit side of said disc structure as the multiplex cable is passed through said disc structure.

9. The device of claim 8 wherein the multiplex cable includes a centrally located bare conductor strand, the insulated strands being wrapped around the bare conductor strand, and wherein said rotatable disc structure further includes a central aperture therein at its axis of rotation, the inner surface of said central aperture being electrically insulated from said conductive members and said commutator system, the bare conductor strand being fed through said central aperture.

10. The device of claim 9 wherein said rotatable disc structure is freely mounted for rotation, having no internal drive therefor, the inherent bias in the twisted strands of the multiplex cable at the entry side of said disc structure serving to cause it to rotate, in turn causing the strands to be retwisted together on the exit side of said disc structure as the multiplex cable is pulled through said disc structure.

11. The method of detecting and correcting faults in the insulation in insulated strands in a multiplex cable which includes a central bare conductor strand with the insulated strands wrapped around it comprising the following steps:

a. providing a fault locator device comprising a rotatable disc structure having a series of elongated conductive hollow tubular members therein insulated from each other and symmetrically and evenly disposed about its center of rotation and a central aperture electrically insulated from said conductive members, said disc structure having an entry side and an exit side and having an electrical commutator system electrically connected to said conductive members; and support means for supporting said disc structure allowing the rotation thereof; b. untwisting the strands of the multiplex cable on the entry side of said disc structure and individually feeding the insulated strands through separate ones of said conductive members and feeding the bare conductor strand through said central aperture;

c. superimposing a high voltage signal on said commutator system and said conductive members setting up an electromagnetic field therein around each of the insulated strands;

d. detecting any changes in the signals set up in the inner conductors in said insulated strands due to the presence of faults in the insulation and noting any such changes; and e. rotating said disc structure and retwisting the strands of the multiplex cable on the exit side of said disc structure.

12. The method of claim 11 wherein in step "d", in detecting and noting such changes, there is further included the steps of setting off an alarm, stopping the machine and correcting the noted fault(s).

* * * * *